(12) United States Patent
Huang et al.

(10) Patent No.: US 8,698,326 B2
(45) Date of Patent: Apr. 15, 2014

(54) SEMICONDUCTOR PACKAGE AND FABRICATION METHOD THEREOF

(75) Inventors: Wen-Home Huang, Taiwan (CN); Wen-Tsung Tseng, Taichung (TW); Chang-Fu Lin, Taiwan (CN); Ho-Yi Tsai, Taichung Hsien (TW); Cheng-Hsu Hsiao, Taichung Hsien (TW)

(73) Assignee: Silconware Precision Industries Co., Ltd., Taichung (TW)

( * ) Notice: Subject to any disclaimer, the term of this patent is extended or adjusted under 35 U.S.C. 154(b) by 1055 days.

(21) Appl. No.: 11/900,345

(22) Filed: Sep. 10, 2007

(65) Prior Publication Data

US 2008/0061451 A1  Mar. 13, 2008

(51) Int. Cl.
*H01L 23/28* (2006.01)
*H01L 23/48* (2006.01)

(52) U.S. Cl.
USPC ............. 257/787; 257/778; 257/E23.031

(58) Field of Classification Search
USPC .......................................... 257/787, E23.031
See application file for complete search history.

(56) References Cited

U.S. PATENT DOCUMENTS

| | | | |
|---|---|---|---|
| 5,773,362 A | 6/1998 | Tonti et al. | |
| 6,038,136 A | 3/2000 | Weber | |
| 6,184,064 B1 | 2/2001 | Jiang et al. | |
| 6,225,695 B1 | 5/2001 | Chia et al. | |
| 6,867,487 B2 | 3/2005 | Huang et al. | |
| 6,940,181 B2* | 9/2005 | Derderian et al. | 257/787 |
| 2001/0004544 A1* | 6/2001 | Schoenfeld | 438/460 |
| 2001/0028115 A1* | 10/2001 | Yanagawa et al. | 257/778 |
| 2002/0167006 A1* | 11/2002 | Demizu et al. | 257/48 |
| 2005/0161834 A1* | 7/2005 | Cowens et al. | 257/778 |
| 2006/0263936 A1* | 11/2006 | Hsu | 438/108 |

FOREIGN PATENT DOCUMENTS

TW  I244145  6/1993

\* cited by examiner

*Primary Examiner* — Nitin Parekh
(74) *Attorney, Agent, or Firm* — Edwards Wildman Palmer LLP; Peter F. Corless; Steven M. Jensen

(57) ABSTRACT

A semiconductor package and a fabrication method thereof are disclosed. The fabrication method includes the steps of providing a semiconductor chip having an active surface and a non-active surface opposing to the active surface, roughening a peripheral portion of the non-active surface so as to divide the non-active surface into the peripheral portion formed with a roughened structure and a non-roughened central portion, mounting the semiconductor chip on a chip carrier via a plurality of solder bumps formed on the active surface, forming an encapsulant on the chip carrier to encapsulate the semiconductor chip. The roughened structure formed on the peripheral portion of the non-active surface of the semiconductor chip can reinforce the bonding between the semiconductor chip and the encapsulant, and the non-roughened central portion of the non-active surface of the semiconductor chip can maintain the structural strength of the semiconductor chip.

10 Claims, 5 Drawing Sheets

SEMICONDUCTOR PACKAGE AND FABRICATION METHOD THEREOF

FIELD OF THE INVENTION

The present invention relates to semiconductor packages and fabrication methods thereof, and more particularly, to a flip-chip semiconductor package and a fabrication method thereof.

BACKGROUND OF THE INVENTION

A molded flip-chip semiconductor package is comprised of a semiconductor chip electrically connected to a surface of a substrate via a plurality of solder bumps mounted on an active surface of the semiconductor chip, an encapsulant formed on the surface of the substrate by a molding process to encapsulate the semiconductor chip, and a plurality of solder balls implanted on an opposite surface of the substrate and serving as I/O terminals for electrically connecting the semiconductor chip to an external device. Such package design greatly reduces the size of the package, such that the semiconductor chip and the substrate can be made comparable in size. The flip-chip design also eliminates the use of conventional bonding wires, thereby desirably reducing impedance and enhancing electrical performance of the package. Accordingly, the flip-chip package represents a mainstream packaging technology nowadays. The related prior arts include U.S. Pat. No. 6,038,136, U.S. Pat. No. 6,867,487, and Taiwanese Patent No. 1244145.

With a semiconductor chip becoming larger (greater than 15 mm×15 mm), due to mismatch in coefficient of thermal expansion (CTE) between the semiconductor chip and the encapsulant and also a large contact area therebetween, both the thermal stress and thermal deformation arising during the thermal cycle of chip packaging are directly proportional to a corner-to-center distance of the semiconductor chip, that is, $\delta$ (deformation)=$\alpha$ (coefficient of thermal expansion)×L (a distance from a location where deformation=0)×$\Delta t$ (amount of temperature variation). In particular, corners of a flip-chip semiconductor chip 10 (as shown in FIG. 1) are located farthest from the center of the chip 10 (where deformation=0) and thereby are subjected to the greatest thermal stress and thermal deformation. As a result, delamination usually occurs at the corners of the semiconductor chip and adversely affects the product quality.

To solve the delamination problem, U.S. Pat. Nos. 5,773,362, 6,184,064 and 6,225,695 disclose roughening a non-active surface of a semiconductor chip to thereby reinforce the bonding between the semiconductor chip and an encapsulant that encapsulates the semiconductor chip.

Referring to FIG. 1, which is a cross-sectional view of a conventional molded flip-chip semiconductor package, a semiconductor chip 10 is electrically connected to a substrate 12 via a plurality of solder bumps 11 mounted on an active surface 101 of the semiconductor chip 10, and a roughened structure 100 is formed on the entire non-active surface 102 of the semiconductor chip 10, such that the bonding between the semiconductor chip 10 and an encapsulant 13 formed on the substrate 12 can be enhanced by the roughened structure 100, thereby reducing delamination between the semiconductor chip 10 and the encapsulant 13.

However, roughening the surface of the semiconductor chip decreases the surface strength of the semiconductor chip. For a semiconductor chip to be used in a compact package for a miniaturized electronic product, the semiconductor chip must be thinned, and roughening a non-active surface of such thinned semiconductor chip would greatly reduce the structural strength of the semiconductor chip and thereby lead to cracks of the semiconductor chip. This situation becomes more severe for a thin and large semiconductor chip.

Therefore, the problem to be solved here is to provide a semiconductor package suitable for a large semiconductor chip, which can prevent delamination on the corners of the semiconductor chip, reduction in the structural strength of the semiconductor chip, and cracks of the semiconductor chip.

SUMMARY OF THE INVENTION

In view of the aforesaid drawbacks of the prior art, an objective of the present invention is to provide a semiconductor package and a fabrication method thereof, for packaging a large semiconductor chip.

Another objective of the present invention is to provide a semiconductor package and a fabrication method thereof, for preventing delamination on the corners of a semiconductor chip in the semiconductor package.

Still another objective of the present invention is to provide a semiconductor package and a fabrication method thereof, for preventing cracks of a semiconductor chip caused by roughening the semiconductor chip.

A further objective of the present invention is to provide a semiconductor package and a fabrication method thereof, for maintaining the structural strength of a roughened semiconductor chip.

In order to achieve the above and other objectives, the present invention discloses a semiconductor package comprising a chip carrier, a semiconductor chip, and an encapsulant. The semiconductor chip comprises an active surface and a non-active surface opposing to the active surface. The semiconductor chip is mounted on the chip carrier via a plurality of solder bumps formed on the active surface of the semiconductor chip. The non-active surface of the semiconductor chip comprises a peripheral portion formed with a roughened structure, and a non-roughened central portion. The encapsulant is formed on the chip carrier to encapsulate the semiconductor chip.

The present invention further discloses a fabrication method of a semiconductor package. The fabrication method comprises the steps of: providing a semiconductor chip having an active surface and a non-active surface opposing to the active surface; roughening a peripheral portion of the non-active surface of the semiconductor chip, so as to divide the non-active surface into a non-roughened central portion, and a peripheral portion formed with a roughened structure; mounting the semiconductor chip on a chip carrier via a plurality of solder bumps formed on the active surface of the semiconductor chip; and forming an encapsulant on the chip carrier to encapsulate the semiconductor chip.

The roughened structure on the peripheral portion of the non-active surface of the semiconductor chip is primarily formed at the corners of the semiconductor chip. The roughened structure extends for at least one third of a distance from the corner of the semiconductor chip to a center of the non-active surface of the semiconductor chip, that is, one third of a distance to neutral point (DNP). The roughened structure formed on the non-active surface of the semiconductor chip reinforces the bonding between the semiconductor chip and the encapsulant. The non-roughened central portion of the non-active surface of the semiconductor chip maintains the structural strength of the semiconductor chip.

Therefore, according to the semiconductor package and the fabrication method thereof in the present invention, the peripheral portion of the non-active surface of the semiconductor chip is roughened to form the roughened structure, for example, at the corners of the semiconductor chip. The roughened structure extends for at least one third of the distance to neutral point (DNP), and enhances the bonding between the semiconductor chip and the encapsulant. The non-roughened central portion of the non-active surface of the semiconductor chip maintains the structural strength of the semiconductor chip. Accordingly, the present invention is suitable for packaging a large semiconductor chip, without having delamination on the corners of the semiconductor chip, and without having cracks of the semiconductor chip caused by roughening the entire chip surface in the prior art.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor packages and a fabrication method thereof as proposed in the present invention are described as follows with reference to FIGS. 2 to 5. It should be understood that the drawings are simplified schematic diagrams only showing the elements relevant to the present invention, and the layout of elements could be more complicated in practical implementation.

Figure 1:
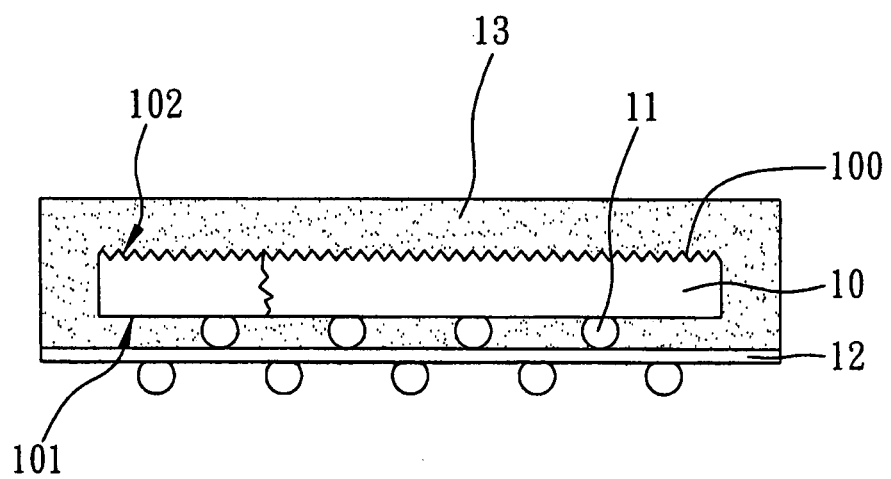
FIG. 1 (PRIOR ART) is a cross-sectional view of a conventional flip-chip semiconductor package.
Figure 2A:
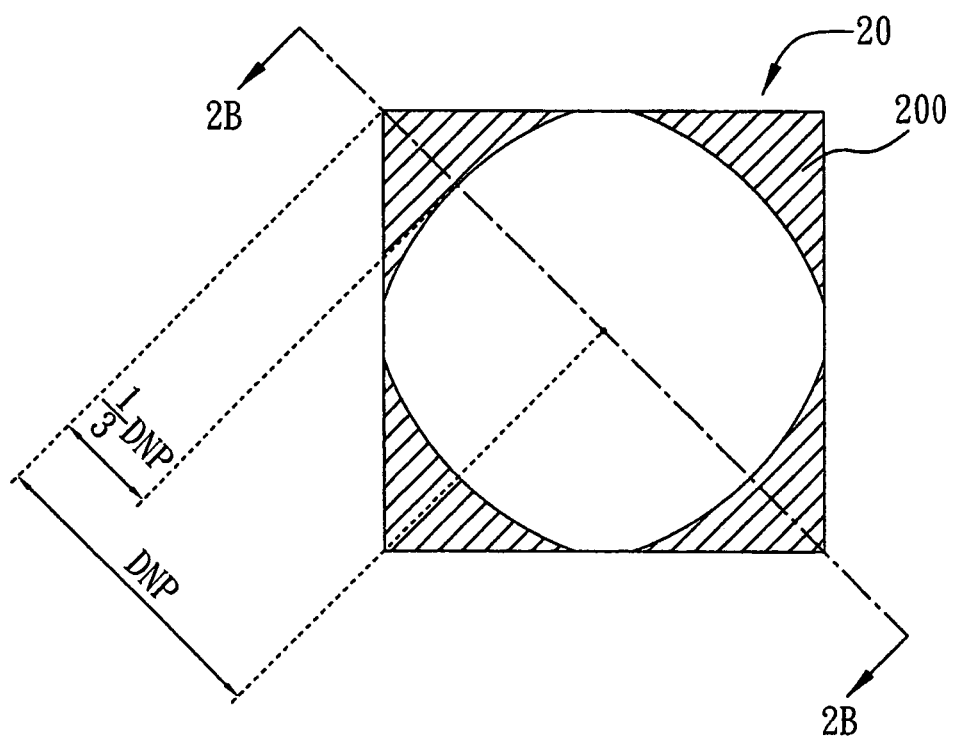
FIGS. 2A to 2C are schematic diagrams showing a semiconductor package and a fabrication method thereof in accordance with the present invention.
Figure 2B:
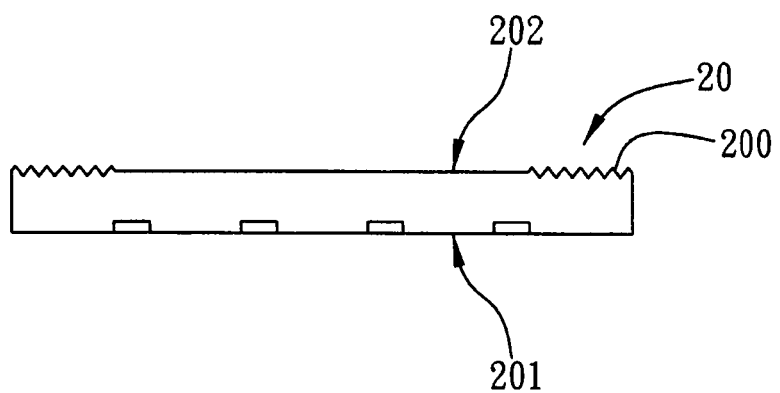
Figure 2C:
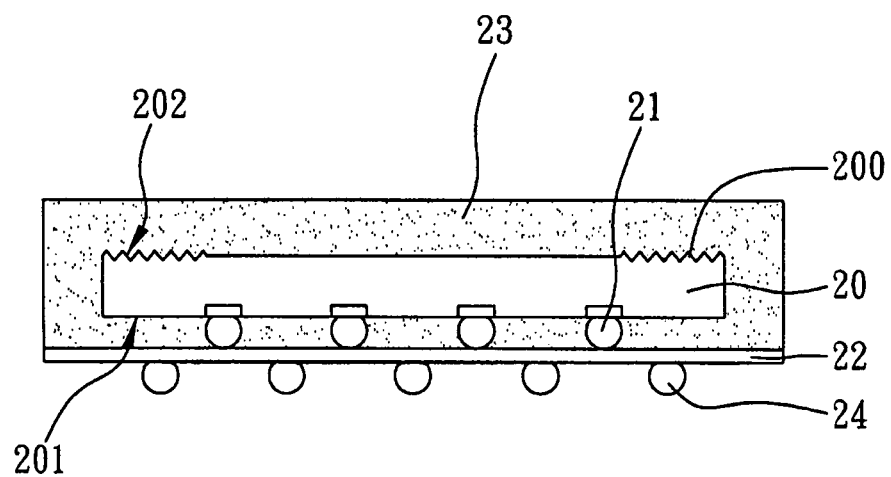

FIGS. 2A to 2C show a semiconductor package and a fabrication method thereof in accordance with the present invention.

As shown in FIGS. 2A and 2B, wherein FIG. 2B is a cross-sectional view of FIG. 2A taken along line 2B-2B, a semiconductor package of the present invention comprises a semiconductor chip 20. The semiconductor chip 20 has an active surface 201 and a non-active surface 202 opposing to the active surface 201. A roughened structure 200 is formed on a peripheral portion of the non-active surface 202 of the semiconductor chip 20, such that the non-active surface 202 is divided into a non-roughened central portion, and the peripheral portion formed with the roughened structure 200.

The roughened structure 200 formed on the peripheral portion of the non-active surface 202 of the semiconductor chip 20 is primarily located at the corners of the semiconductor chip 20. The roughened structure 200 extends for at least one third of a distance from the corner of the non-active surface 202 of the semiconductor chip 20 to a center of the non-active surface 202 of the semiconductor chip 20 (where there is no deformation at the center of the semiconductor chip 20), that is, one third of a distance to neutral point (DNP). The roughened structure 200 formed on the non-active surface 202 of the semiconductor chip 20 reinforces the bonding between the semiconductor chip 20 and an encapsulant to be subsequently formed thereon. The non-roughened central portion of the non-active surface 202 of the semiconductor chip 20 maintains the structural strength of the semiconductor chip 20. The roughened structure 200 is generally formed by a roughening process using laser with a wavelength less than 0.5 µm, plasma, or chemical etching. The depth of the roughened structure 200 is preferably in the range of 0.5 to 5 µm, and more preferably 2 µm.

In this embodiment, the roughened structure 200 comprises discrete portions formed at the four corners of the non-active surface 202 of the semiconductor chip 20 respectively. The roughened structure 200 extends for one third of a distance from the corner to the center of the non-active surface 202 of the semiconductor chip 20, and the central portion, which is not roughened, extends outwardly from the center of the non-active surface 202 of the semiconductor chip 20 for two thirds of the distance to neutral point (DNP).

Prior to formation of the roughened structure 200, the semiconductor chip 20 can be polished to reinforce surface strength thereof, and then the corners of the non-active surface 202 of the semiconductor chip 20 can be roughened to form the roughened structure 200.

Referring to FIG. 2C, the semiconductor chip 20 is mounted on a chip carrier 22 via a plurality of solder bumps 21 formed on the active surface 201 of the semiconductor chip 20, and an encapsulant 23 is formed on the chip carrier 22 to encapsulate the semiconductor chip 20. Thereby, a semiconductor package is obtained.

The chip carrier 22 is, for example, a ball grid array (BGA) substrate. A plurality of solder balls 24 are implanted on a surface of the substrate other than the surface for mounting the semiconductor chip 20, and are used to electrically connect the semiconductor chip 20 to an external device. Alternatively, the chip carrier 22 can be a lead frame.

Figure 3:
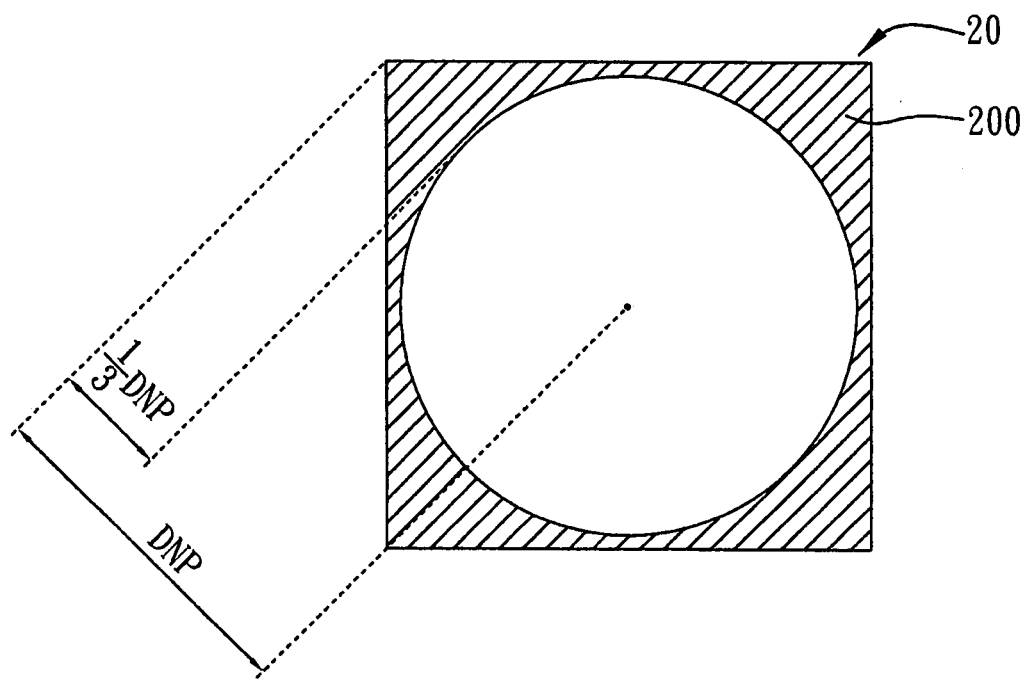
FIGS. 3 to 5 are top views of a semiconductor chip in accordance with other embodiments of the present invention.
Figure 4:
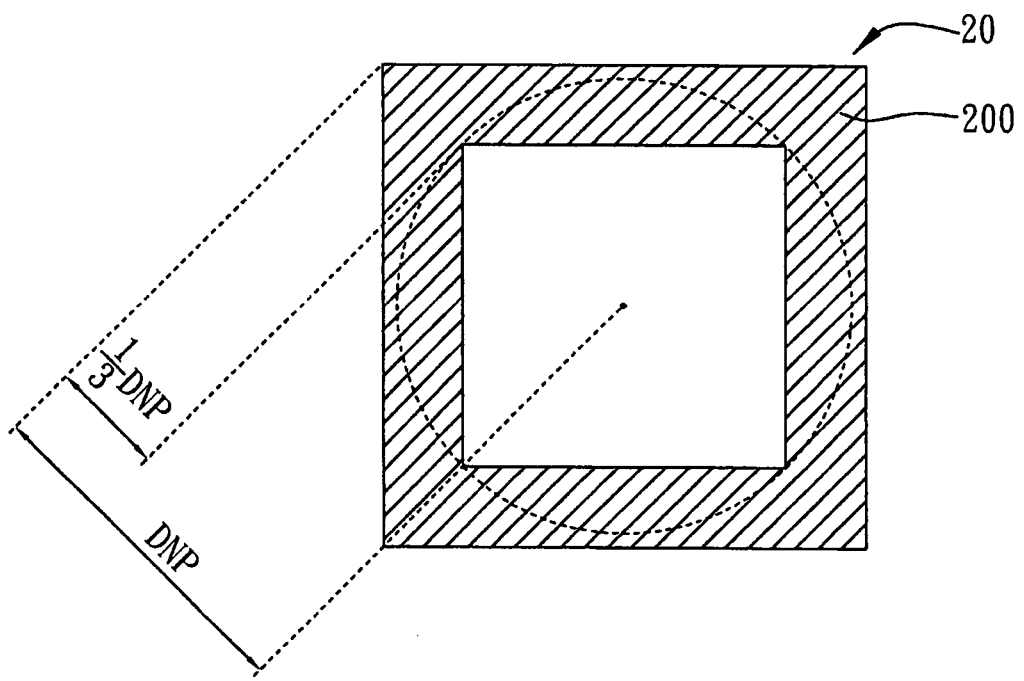
Figure 5:
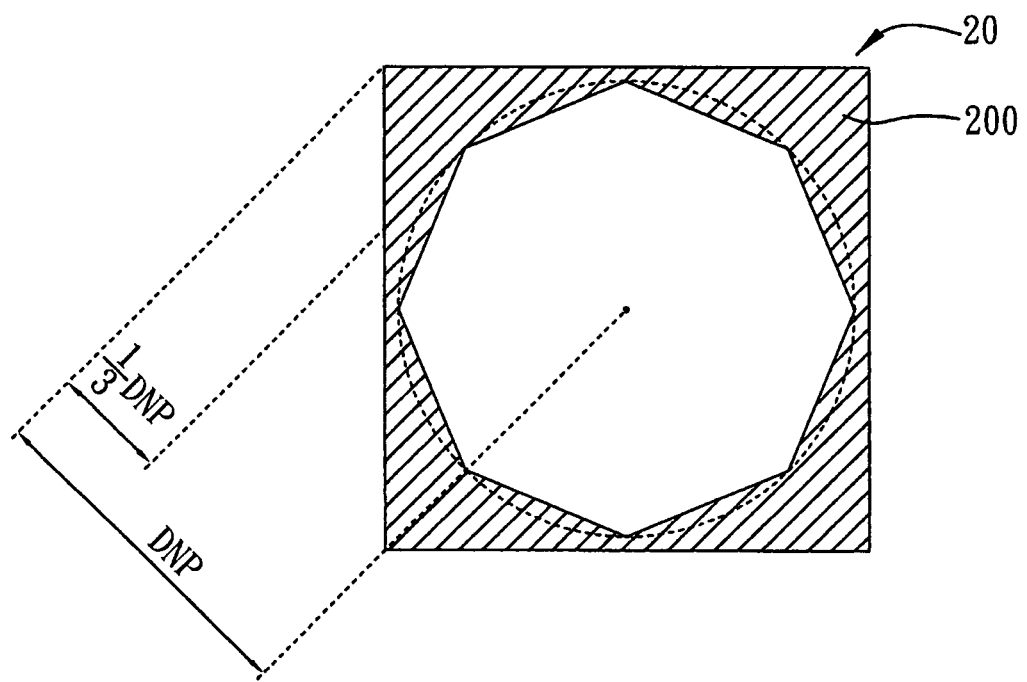

FIGS. 3 to 5 are top views of a semiconductor chip 20 in accordance with different embodiments of the present invention. As shown in FIGS. 3 to 5, the non-roughened central portion of the non-active surface of the semiconductor chip 20 is shaped as a circle (FIG. 3), a rectangle (FIG. 4), or a polygon (FIG. 5). The roughened structure 200 formed on the peripheral portion of the non-active surface of the semiconductor chip 20 extends for at least one third of a distance from the corner to the center of the non-active surface of the semiconductor chip 20, and extends on all edges of the non-active surface of the semiconductor chip 20. With the non-active surface of the semiconductor chip 20 comprising both the peripheral portion with the roughened structure 200 and the non-roughened central portion, the bonding between the semiconductor chip 20 and the encapsulant that encapsulates the semiconductor chip 20 can be enhanced by the roughened structure 200, and also the structural strength of the semiconductor chip 20 can be maintained by the non-roughened central portion. Accordingly, the present invention is suitable for packaging a large semiconductor chip, without having delamination on the corners of the semiconductor chip and without having cracks of the semiconductor chip caused by roughening the entire chip surface in the prior art.

The aforesaid embodiments merely serve as the preferred embodiments of the present invention. They should not be construed as to limit the scope of the present invention in any way. Hence, any other changes can actually be made in the present invention. It will be apparent to those skilled in the art that all equivalent modifications or changes made, without departing from the spirit and the technical concepts disclosed by the present invention, should fall within the scope of the appended claims.

What is claimed is:

1. A semiconductor package, comprising:
   a chip carrier;
   a semiconductor chip having an active surface, a non-active surface opposing to the active surface, and a side surface adjacent to the active surface and the non-active surface, wherein the semiconductor chip is mounted on the chip carrier via a plurality of solder bumps formed on the active surface of the semiconductor chip, and wherein one part of the non-active surface of the semiconductor chip is a roughened structure, another part of the non-active surface of the semiconductor chip is a non-roughened central portion, and the roughened structure surrounds the non-roughened central portion; and an encapsulant formed on the chip carrier to encapsulate the semiconductor chip.

2. The semiconductor package of claim 1, wherein the roughened structure is formed on at least one corner of the non-active surface of the semiconductor chip.

3. The semiconductor package of claim 2, wherein the roughened structure extends for at least one third of a distance from the corner to a center of the non-active surface of the semiconductor chip.

4. The semiconductor package of claim 2, wherein the roughened structure is formed by one selected from the group consisting of laser with a wavelength less than 0.5 μm, plasma, and chemical etching, and the roughened structure has a depth of 0.5 to 5 μm.

5. The semiconductor package of claim 2, wherein the roughened structure is formed at four corners of the non-active surface of the semiconductor chip.

6. The semiconductor package of claim 2, wherein the roughened structure comprises discrete portions formed at four corners of the non-active surface of the semiconductor chip respectively.

7. The semiconductor package of claim 2, wherein the semiconductor chip is polished to reinforce surface strength thereof, and the roughened structure is formed at the corner of the non-active surface of the polished semiconductor chip.

8. The semiconductor package of claim 2, wherein the chip carrier is one of a ball grid array (BGA) substrate and a lead frame.

9. The semiconductor package of claim 2, wherein the non-roughened central portion of the non-active surface of the semiconductor chip has a shape selected from the group consisting of a circle, a rectangle, and a polygon.

10. The semiconductor package of claim 2, wherein the roughened structure extends for at least one third of a distance from the corner to a center of the non-active surface of the semiconductor chip, and extends on all edges of the non-active surface of the semiconductor chip.

* * * * *